(12) United States Patent
Gopalakrishnan et al.

(10) Patent No.: US 12,046,946 B2
(45) Date of Patent: Jul. 23, 2024

(54) APPARATUS AND METHOD FOR VEHICLE LOW VOLTAGE POWER NET OPERATION WITH DISCONNECTED BATTERY

(71) Applicant: GM Global Technology Operations LLC, Detroit, MI (US)

(72) Inventors: Suresh Gopalakrishnan, Troy, MI (US); Chandra S. Namuduri, Troy, MI (US); Norman K. Bucknor, Troy, MI (US); Lyall Kenneth Winger, Waterloo (CA); James Morrison, Sebringville (CA); David W. Walters, Sterling Heights, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 30 days.

(21) Appl. No.: 17/889,017

(22) Filed: Aug. 16, 2022

(65) Prior Publication Data
US 2024/0063655 A1   Feb. 22, 2024

(51) Int. Cl.
*H02J 9/06*   (2006.01)
*B60L 53/20*   (2019.01)
*B60L 58/10*   (2019.01)
*G01R 19/165*   (2006.01)
*H02J 7/00*   (2006.01)

(52) U.S. Cl.
CPC .............. *H02J 9/061* (2013.01); *B60L 53/20* (2019.02); *B60L 58/10* (2019.02); *G01R 19/16576* (2013.01); *H02J 7/0063* (2013.01); *H02J 7/00712* (2020.01); *B60L 2210/10* (2013.01)

(58) Field of Classification Search
CPC ...... H02J 9/061; H02J 7/00712; H02J 7/0063; B60L 53/20; B60L 58/10; B60L 2210/10; G01R 19/16576
USPC .................................................. 307/9.1, 10.1
See application file for complete search history.

(56) References Cited

FOREIGN PATENT DOCUMENTS

EP    3965256 A1 *  3/2022   .......... H02J 7/00308

OTHER PUBLICATIONS

English translation of EP 3965256 A1, published Mar. 9, 2022. (Year: 2022).*

* cited by examiner

*Primary Examiner* — Hal Kaplan
(74) *Attorney, Agent, or Firm* — CANTOR COLBURN LLP

(57) ABSTRACT

A vehicle, an electrical system of the vehicle and a method of operating the vehicle. The electrical system includes a battery, an electrical load that draws power from the battery, a switch between the battery and the electrical load, and a processor. The processor is configured to measure a power drawn from the battery by the electrical load and open the switch to disconnect the battery from the electrical load when the power drawn by the electrical load matches a selected criterion.

20 Claims, 6 Drawing Sheets

APPARATUS AND METHOD FOR VEHICLE LOW VOLTAGE POWER NET OPERATION WITH DISCONNECTED BATTERY

INTRODUCTION

The subject disclosure relates to the operation of an electrical system in a vehicle and, in particular, to an apparatus and method for disconnecting a battery under suitable conditions.

An electrical system in a vehicle includes one or more power sources and one or more electrical loads which draw power from them. The one or more power sources can include a battery. The amount of power drawn by an electrical load can change over time. The battery needs to be recharged once its power is drawn. Unnecessarily drawing power from the battery affects not only fuel economy and the range of the vehicle but also $CO_2$ emissions. Accordingly, it is desirable to provide a system and method for adjusting the one or more power sources to meet the varying needs of the electrical loads.

SUMMARY

In one exemplary embodiment, a method of operating a vehicle is disclosed. A power drawn by an electrical load in an electrical system of the vehicle is measured. The electrical system includes a battery that provides the power to the electrical load. The battery is disconnected from the electrical system when the power drawn by the electrical load matches a selected criterion.

In addition to one or more of the features described herein, the selected criterion is that the power is constant over a selected time period. The method further includes drawing the power to the electrical load after the battery is disconnected from at least one of a generator and a DC/DC converter connected to a high voltage source. Disconnecting the battery further includes setting a generator voltage of the generator to that is less than a battery voltage. The method further includes reconnecting the battery to the electrical system when a system voltage falls below a minimum voltage threshold. The method further includes generating a comparator voltage signal at a comparator in response to a comparison of the system voltage to the minimum voltage and performing a logical operation between the comparator voltage signal and a switch control signal. Wherein reconnecting the battery includes overriding a switch control signal, the method further includes releasing the override when the system voltage rises above a return voltage that is greater than the minimum voltage.

In another exemplary embodiment, an electrical system of a vehicle is disclosed. The electrical system includes a battery, an electrical load that draws a power from the battery, a switch between the battery and the electrical load, and a processor. The processor is configured to measure the power drawn from the battery by the electrical load and open the switch to disconnect the battery from the electrical load when the power drawn by the electrical load matches a selected criterion.

In addition to one or more of the features described herein, the selected criterion is that the power is constant over a selected time period. The electrical system further includes at least one of a generator and a DC/DC converter connected to a high voltage source, wherein the electrical load draws the power from the at least one of the generator and the DC/DC converter connected to the high voltage source after the battery is disconnected. The processor is further configured to set a generator voltage of the generator to less than a battery voltage upon disconnecting the battery. The processor is further configured to reconnect the battery when a system voltage falls below a minimum voltage threshold. The electrical system further includes a comparator configured to generate a comparator voltage signal in response to a comparison of the system voltage to the minimum voltage and a logic circuit that performs a logical operation between the comparator voltage signal and a switch control signal. The comparator voltage signal overrides the switch control signal at the logic circuit when the system voltage fall below the minimum voltage and the comparator voltage signal no longer overrides the switch control signal at the logic circuit when the system voltage rises above a return voltage that is greater than the minimum voltage.

In yet another exemplary embodiment, a vehicle is disclosed. The vehicle includes a battery, an electrical load that draws a power from the battery, a switch between the battery and the electrical load, and a processor. The processor is configured to measure the power drawn from the battery by the electrical load and open the switch to disconnect the battery from the electrical load when the power drawn by the electrical load matches a selected criterion.

In addition to one or more of the features described herein, the selected criterion is that the power is constant over a selected time period. The vehicle further includes at least one of a generator and a DC/DC converter connected to a high voltage source, wherein the electrical load draws the power from the at least one of the generator and the DC/DC converter connected to the high voltage source after the battery is disconnected. The processor is further configured to set a generator voltage of the generator to less than a battery voltage upon disconnecting the battery. The processor is further configured to reconnect the battery when a system voltage falls below a minimum voltage threshold. The vehicle further includes a comparator configured to generate a comparator voltage signal in response to a comparison of the system voltage to the minimum voltage and a logic circuit that performs a logical operation between the comparator voltage signal and a switch control signal, wherein the comparator voltage signal overrides the switch control signal at the logic circuit when the system voltage fall below the minimum voltage and wherein the comparator voltage signal no longer overrides the switch control signal at the logic circuit when the system voltage rises above a return voltage that is greater than the minimum voltage.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
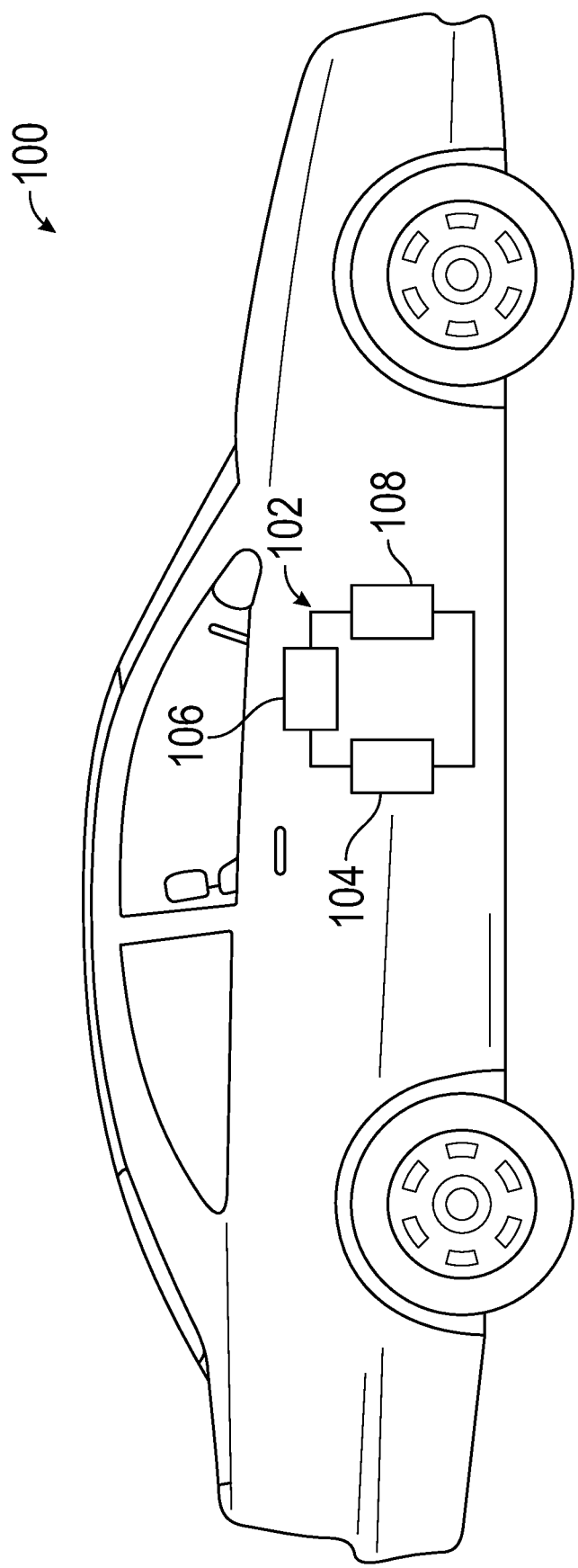
FIG. 1 shows a vehicle in accordance with an exemplary embodiment.

The following description is merely exemplary in nature and is not intended to limit the present disclosure, its application or uses. It should be understood that throughout the drawings, corresponding reference numerals indicate like or corresponding parts and features.

In accordance with an exemplary embodiment, FIG. 1 shows a vehicle 100. The vehicle 100 can be a gas-powered vehicle, an electric vehicle or a hybrid vehicle, in various embodiments. The vehicle 100 generally includes an electrical system 102. The electrical system 102 includes one or more power sources 104, a battery electrical center 106 and one or more electrical loads 108. The one or more power sources 104 can include a battery, a generator, etc. The battery electrical center 106 is a smart electrical system that includes components for monitoring and controlling various electrical operations of the vehicle, such as a starter motor, a generator, power windows, electrical communications, entertainment systems, etc. The battery electrical center 106 can include sensors that measure a voltage, current, resistance and/or power at the one or more electrical loads 108.

Figure 2:
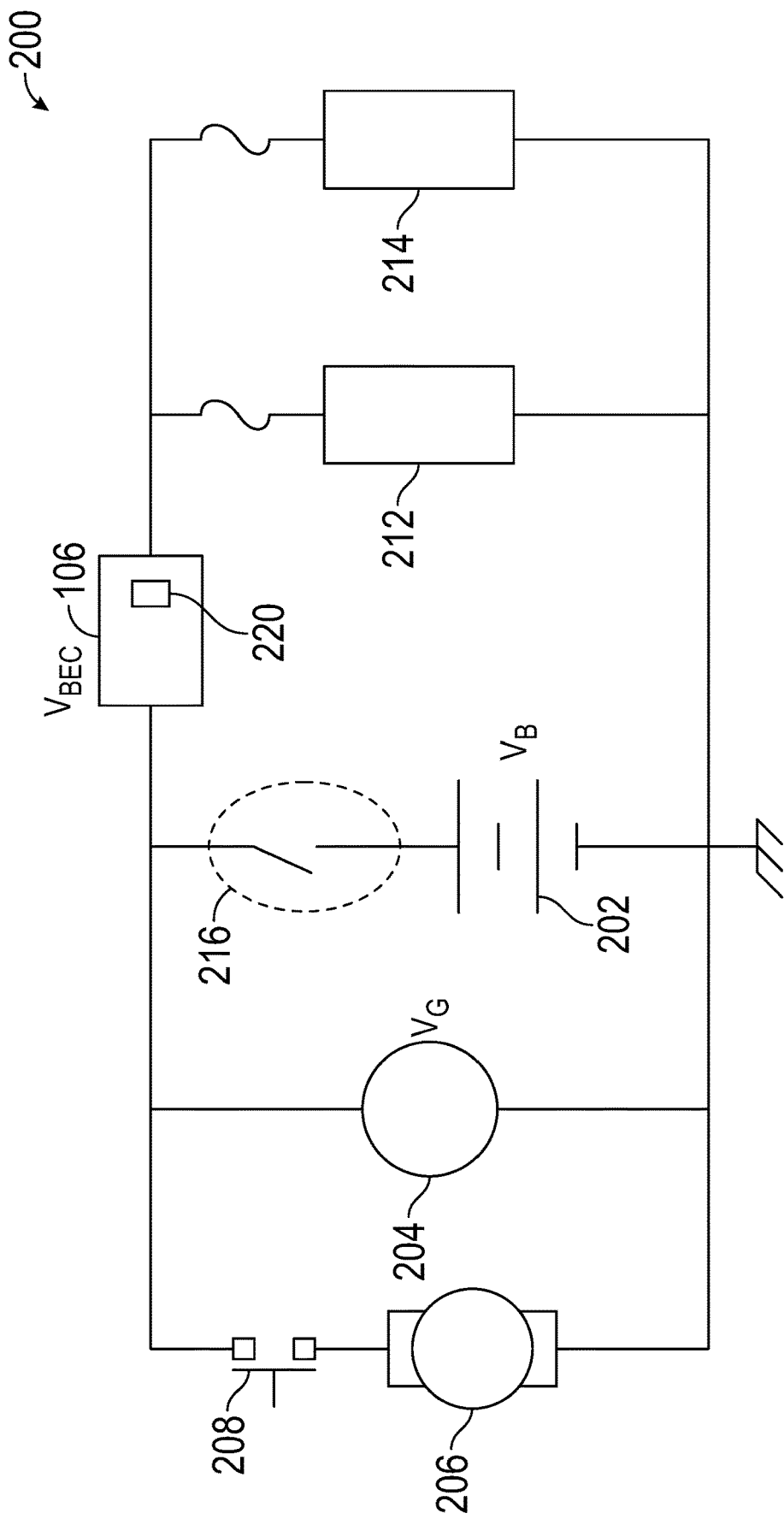
FIG. 2 shows a circuit diagram of an electrical system for a non-electric vehicle.

FIG. 2 shows a circuit diagram of an electrical system 200 for a non-electric vehicle. In various embodiments, a non-electric vehicle can include a vehicle that operates using an internal combustion engine. The electrical system 200 includes a battery 202 and a generator 204 as power sources. The battery 202 and the generator 204 are in parallel with each other. A starter motor 206 is connectable to the power sources via a solenoid switch 208. The battery 202 and generator 204 establish a system voltage $V_{BEC}$ at the battery electrical center 106, which produces a current at the electrical loads. The electrical loads are represented by a first electrical load 212 and a second electrical load 214 for illustrative purposes. The first electrical load 212 represents one or more constant power loads while the second electrical load 214 represents one or more constant resistance loads. The one or more constant resistance loads have changing power requirements.

The battery 202 supplies a battery voltage $V_B$ and the generator 204 supplies a generator voltage $V_G$. The battery 202 can be removed and introduced into the circuit via a switch 216 located along the branch of the battery. The switch 216 can be controlled by a processor 220 associated with the battery electrical center 106. When the switch 216 is closed, the battery 202 is connected into the circuit and the vehicle operates in a normal mode. When the switch is open, the battery is disconnected from the circuit and the vehicle operates in a fuel economy mode.

The processor 220 can measure and monitor the power drawn at the various electrical loads. The processor 220 configures the switch 216 by sending a switch control signal to the switch 216. The switch control signal can be a binary signal that either opens or closes the switch 216.

In a normal mode of operation, the battery 202 is connected into the circuit. When the battery 202 is connected, the $V_{BEC}$ is dependent on $V_G$, $V_B$ and the load current. In a fuel economy mode of operation, the battery 202 is disconnected and the generator voltage $V_G$ is set to a set point voltage that is lower than the battery voltage $V_B$. As a result, the system voltage is set at the generator voltage ($V_{BEC}=V_G$). The set point of the generator 204 can be selected based on the state of charge and the temperature of the battery 202.

The reduction in power $\Delta P$ drawn by the one or more constant resistance loads between normal mode and fuel economy mode is given in Eq. (1):

$$\Delta P = \frac{V_B^2}{R} - \frac{V_G^2}{R} \qquad \text{Eq. (1)}$$

where R is the resistance of the constant resistance loads. For illustrative purposes, $V_B$=+12.0 V and $V_G$=+10.5 V and the resulting power reduction is 48.51V/R. Additional power savings come from the fact that the battery does not discharge when it is disconnected from the circuit and thus does not require recharging. Not having to charge the battery prevents additional power loss due to charging inefficiencies.

The processor 220 can switch the vehicle 100 to the fuel economy mode when the power drawn by the constant resistivity loads meets a criterion. In various embodiments, the criterion is that the power is stable (i.e., remains within a selected delta value) for a selected amount of time. The fuel economy mode allows for energy and charge conservation, higher fuel economy and a reduction in $CO_2$ emissions. Any accessory load power reduction improves the fuel economy and $CO_2$ emissions of the vehicle.

Figure 3:
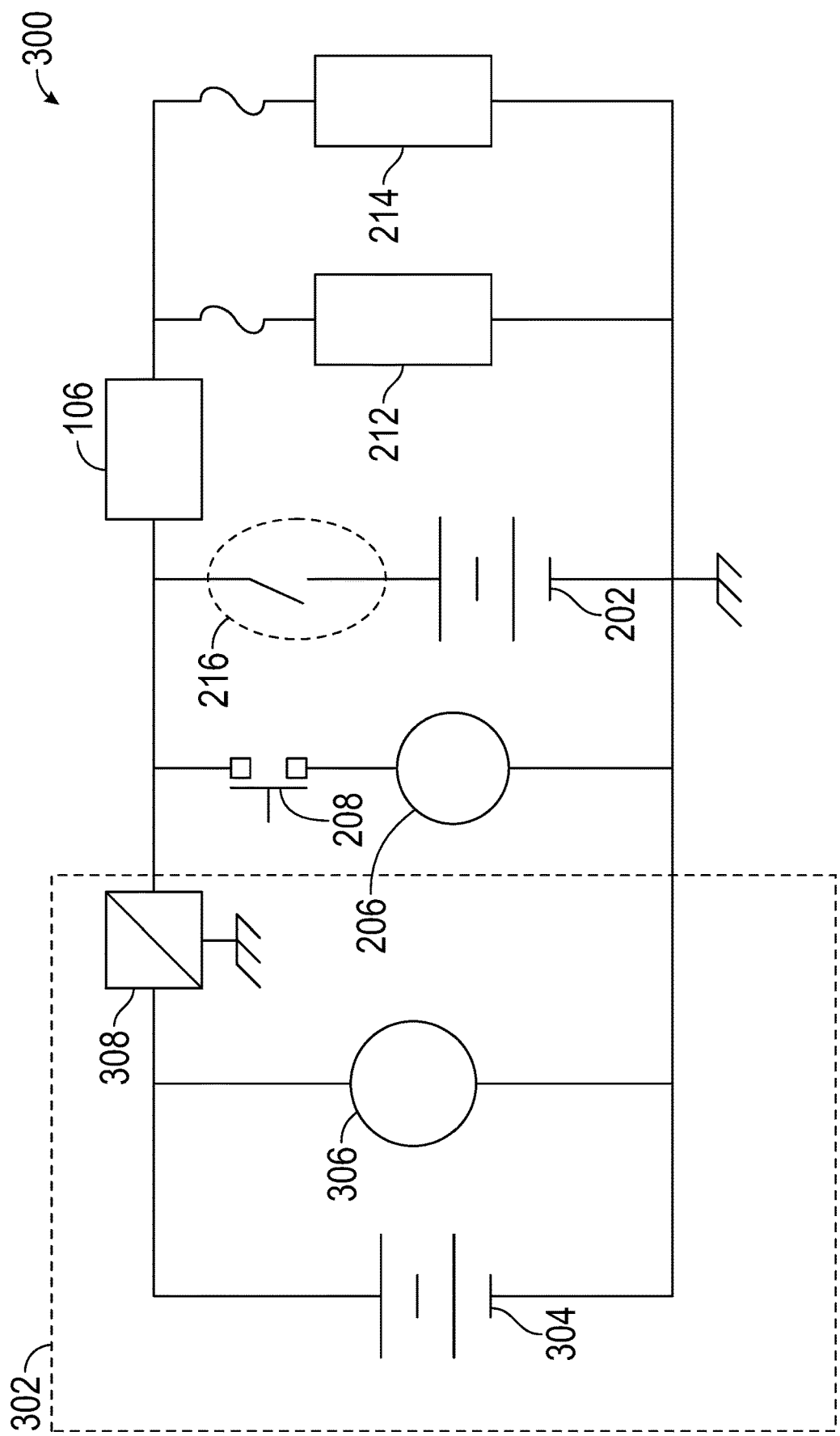
FIG. 3 shows a circuit diagram of an electrical system for a hybrid vehicle.

FIG. 3 shows a circuit diagram of an electrical system 300 for a hybrid vehicle. The electrical system 300 includes the battery 202, starter motor 206, solenoid switch 208, battery electrical center 106, first electrical load 212, second electrical load 214, and switch 216. The electrical system 300 further includes a hybrid vehicle generator equivalent 302 that supplements the battery 202. In an illustrative embodiment, the hybrid vehicle generator equivalent 302 can include a high voltage battery 304 (e.g., a +48-volt battery), a motor/generator unit (MGU 306) and an auxiliary power module (APM 308). The MGU 306 is useful in starting the vehicle. The APM 308 performs DC/DC conversion to provide a generator voltage $V_G$ suitable for charging the battery 202 while supplying the electrical loads.

Figure 4:
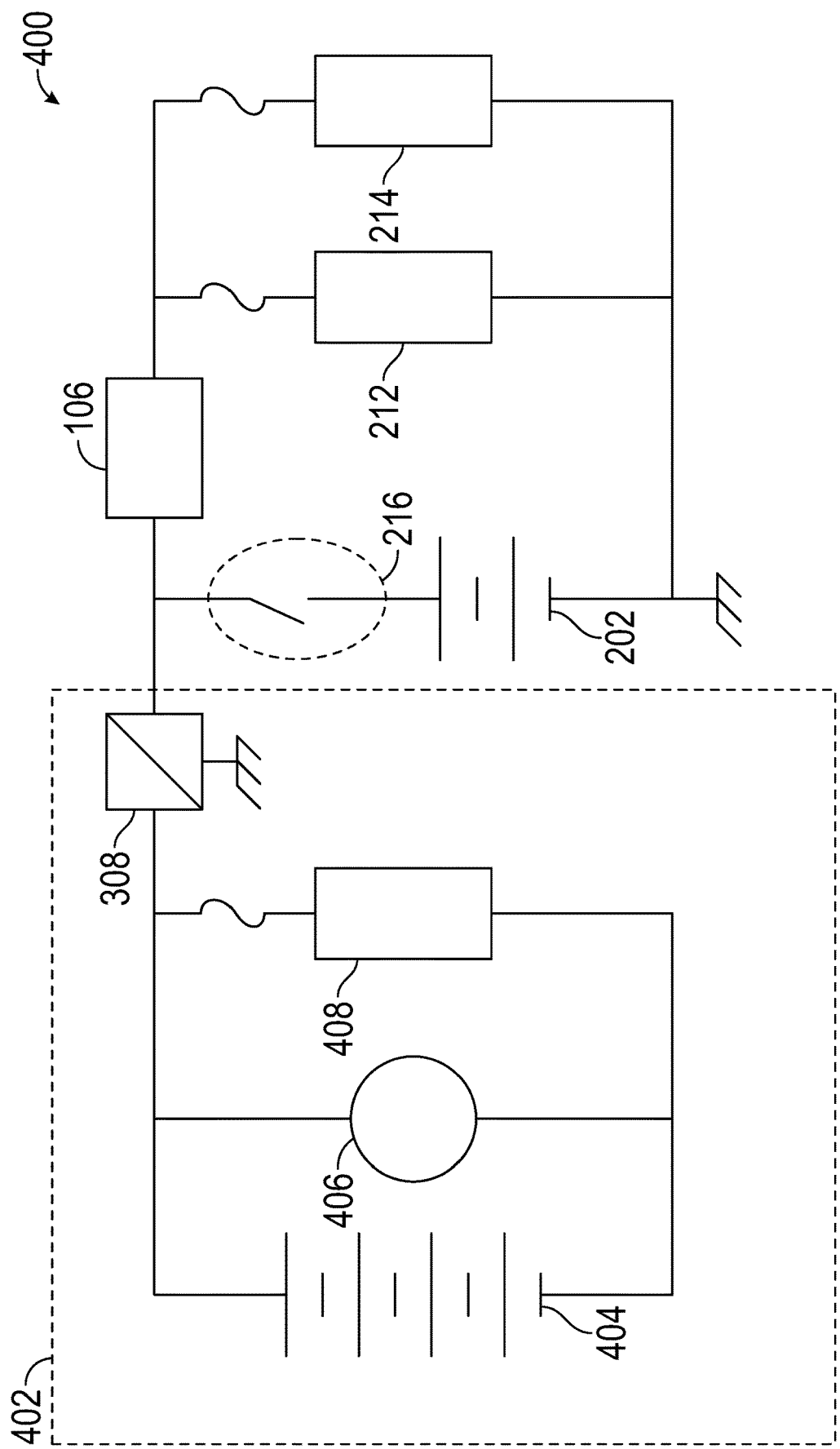
FIG. 4 shows a circuit diagram of an electrical system for an electric vehicle.

FIG. 4 shows a circuit diagram of an electrical system 400 for an electric vehicle. The electrical system 400 includes the battery 202, battery electrical center 106, first electrical load 212, second electrical load 214, and switch 216. The electrical system 400 further includes an electric vehicle generator equivalent 402 that supplements the battery 202. In an illustrative embodiment, the electric vehicle generator equivalent 402 can include a high voltage battery 404 (e.g., a +400-volt battery), a traction power inverter module (TPIM 406), high voltage loads 408 and an auxiliary power module (APM 308). The high voltage battery 404 and the TPIM 406 provide a high voltage to the APM 308. The APM 308 performs DC/DC conversion to provide a generator equivalent voltage suitable for charging the battery 202 while supplying the electrical loads.

For the circuits shown in FIGS. 2, 3 and 4, a switch control signal is directed directly from the processor 220 to the switch 216. To provide stability of the circuits against a transient voltage, a comparator circuit is used to monitor voltage and to act accordingly, as described in FIG. 5.

Figure 5:
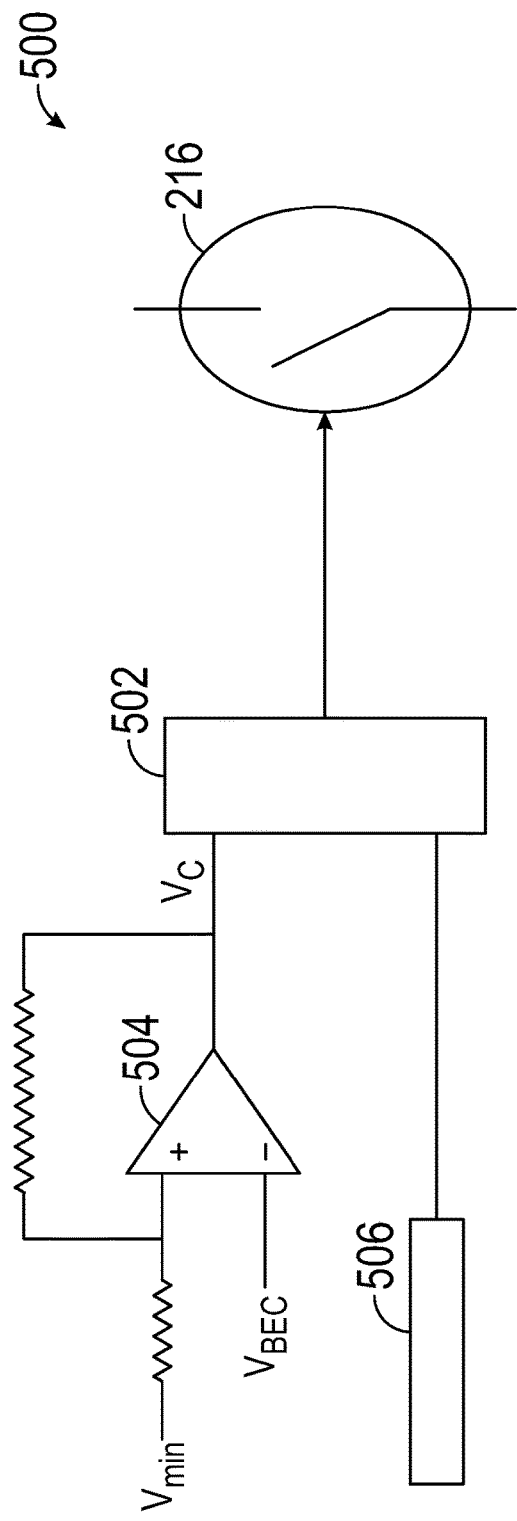
FIG. 5 shows a control circuit for the switch for providing stability of the electrical system against the occurrence of a transient voltage.

FIG. 5 shows a control circuit 500 for the switch 216 for providing stability of the electrical system against the occurrence of a transient voltage. The control circuit 500 includes a logic circuit 502 and a comparator 504. The logic circuit 502 provides a control signal to the switch 216. In various embodiments, the logic circuit 502 is an OR gate. The control signal is a logical output of a first input and a second input to the OR gate. The first input is the switch control signal 506 that otherwise would be sent directly to the switch 216. The second input is an output signal $V_C$ generated at the comparator 504. The switch control signal and the comparator signal $V_C$ both hold binary values.

The comparator 504 compares the system voltage $V_{BEC}$ to a minimum voltage $V_{min}$. When the system voltage $V_{BEC}$ drops below the minimum voltage $V_{min}$, the comparator voltage $V_C$ switches from a low voltage to a high voltage, causing the logic circuit 502 to override the switch control signal 506. If the switch 216 is open (fuel economy mode), the control signal closes the switch 216 to introduce the battery into the circuit.

Figure 6:
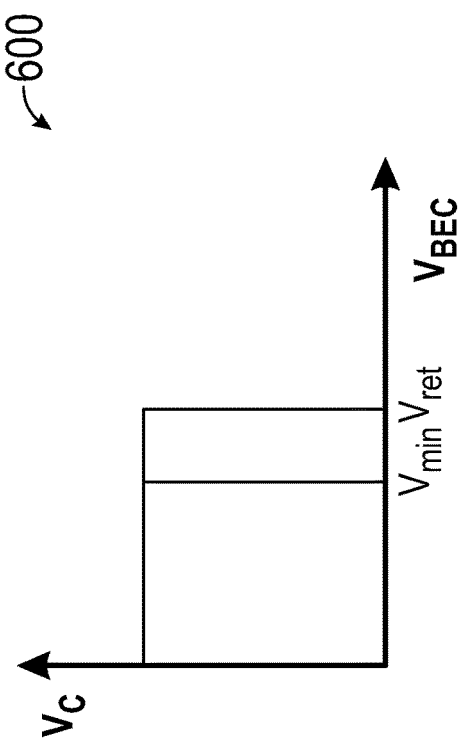
FIG. 6 shows a hysteresis loop of the comparator circuit used in the control circuit of FIG. 5.

The comparator circuit is designed to operate with along a hysteresis loop 600 as shown in FIG. 6. Once the system voltage $V_{BEC}$ has dropped below the minimum voltage $V_{min}$, causing the comparator voltage $V_C$ to go high and introducing the battery into the circuit, the system voltage $V_{BEC}$ must rise above a return voltage $V_{ret}$ in order to reset the comparator voltage $V_C$ to the lower voltage and remove the battery from the circuit. The control signal can open and close the switch 216 within a few micro-seconds.

Figure 7:
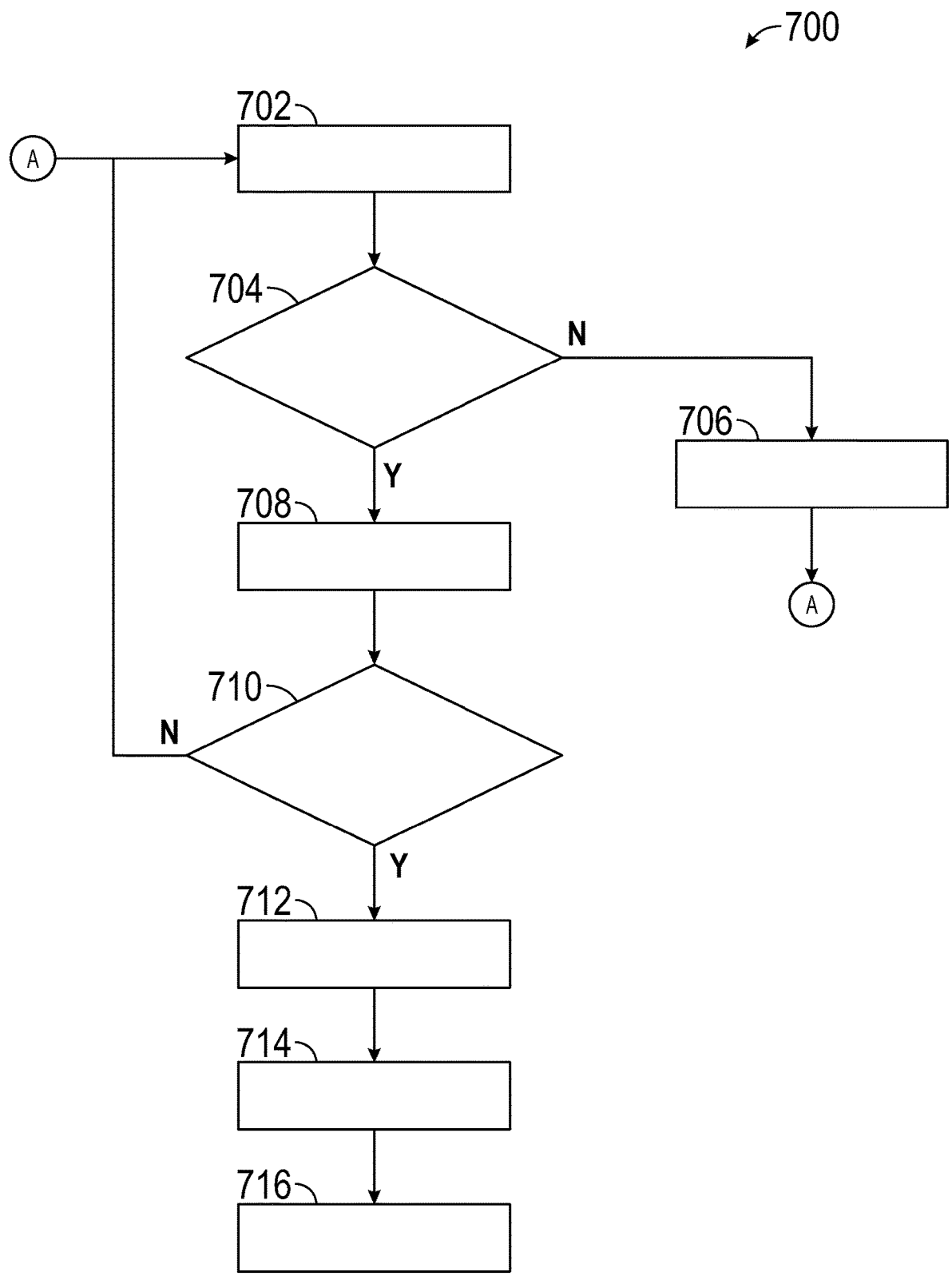
FIG. 7 shows a flowchart illustrating operation of the vehicle using the methods disclosed herein.

FIG. 7 shows a flowchart 700 illustrating operation of the vehicle using the methods disclosed herein. In box 702, the vehicle is in an ON state. In box 704, a check is made that the state of charge of the battery is greater than a target value. Also a check is made as to whether other conditions are met, such as a constant power being drawn by the electrical loads. If these conditions are not met, the method proceeds to box 706 in which the battery switch turned to ON (i.e., switch closed, battery in circuit). The method then loops back to box 702. Still at box 704, if these conditions are met, the method flows to box 708. In box 708, the battery switch is turned to OFF (i.e., switch open, battery not in circuit). From box 708, the method proceeds to box 710. In box 710, a check is made for a vehicle OFF request. If no request is made, the method loops back to box 702. Returning to box 710, if a request is made, the method proceeds to box 712. In box 712, the battery is switched ON. In box 714, the vehicle is turned off. The method ends at box 716.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this invention belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof

What is claimed is:

1. A method of operating a vehicle, comprising:
   measuring a power drawn by an electrical load in an electrical system of the vehicle, the electrical system including a battery that provides the power to the electrical load; and
   disconnecting the battery from the electrical system when the power drawn by the electrical load is constant over a selected time period.

2. The method of claim 1, further comprising drawing the power to the electrical load after the battery is disconnected from at least one of: (i) a generator; and (ii) a DC/DC converter connected to a high voltage source.

3. The method of claim 2, wherein disconnecting the battery further comprises setting a generator voltage of the generator to less than a battery voltage.

4. The method of claim 1, further comprising reconnecting the battery to the electrical system when a system voltage falls below a minimum voltage.

5. The method of claim 4, further comprising generating a comparator voltage signal at a comparator in response to a comparison of the system voltage to the minimum voltage and performing a logical operation between the comparator voltage signal and a switch control signal.

6. The method of claim 4, wherein reconnecting the battery includes overriding a switch control signal, further comprising releasing an override when the system voltage rises above a return voltage that is greater than the minimum voltage.

7. The method of claim 1, further comprising reconnecting the battery upon receiving a request to turn off the vehicle.

8. An electrical system of a vehicle, comprising:
   a battery;
   an electrical load that draws a power from the battery;
   a switch between the battery and the electrical load; and
   a processor configured to:
      measure the power drawn from the battery by the electrical load, and
      open the switch to disconnect the battery from the electrical load when the power drawn by the electrical load is constant over a selected time period.

9. The electrical system of claim 8, further comprising at least one of a generator and a DC/DC converter connected to a high voltage source, wherein the electrical load draws the power from the at least one of the generator and the DC/DC converter connected to the high voltage source after the battery is disconnected.

10. The electrical system of claim 9, wherein the processor is further configured to set a generator voltage of the generator to less than a battery voltage upon disconnecting the battery.

11. The electrical system of claim 8, wherein the processor is further configured to reconnect the battery when a system voltage falls below a minimum voltage.

12. The electrical system of claim 11, further comprising a comparator configured to generate a comparator voltage signal in response to a comparison of the system voltage to the minimum voltage and a logic circuit that performs a logical operation between the comparator voltage signal and a switch control signal.

13. The electrical system of claim 12, wherein the comparator voltage signal overrides the switch control signal at the logic circuit when the system voltage falls below the minimum voltage and wherein the comparator voltage signal no longer overrides the switch control signal at the logic circuit when the system voltage rises above a return voltage that is greater than the minimum voltage.

14. The electrical system of claim 8, wherein the processor is further configured to reconnect the battery upon receiving a request to turn off the vehicle.

15. A vehicle, comprising:
a battery;
an electrical load that draws a power from the battery;
a switch between the battery and the electrical load; and
a processor configured to:
  measure the power drawn from the battery by the electrical load, and
  open the switch to disconnect the battery from the electrical load when the power drawn by the electrical load is constant over a selected time period.

16. The vehicle of claim 15, further comprising at least one of a generator and a DC/DC converter connected to a high voltage source, wherein the electrical load draws the power from the at least one of the generator and the DC/DC converter connected to the high voltage source after the battery is disconnected.

17. The vehicle of claim 16, wherein the processor is further configured to set a generator voltage of the generator to less than a battery voltage upon disconnecting the battery.

18. The vehicle of claim 15, wherein the processor is further configured to reconnect the battery when a system voltage falls below a minimum voltage.

19. The vehicle of claim 18, further comprising a comparator configured to generate a comparator voltage signal in response to a comparison of the system voltage to the minimum voltage and a logic circuit that performs a logical operation between the comparator voltage signal and a switch control signal, wherein the comparator voltage signal overrides the switch control signal at the logic circuit when the system voltage falls below the minimum voltage and wherein the comparator voltage signal no longer overrides the switch control signal at the logic circuit when the system voltage rises above a return voltage that is greater than the minimum voltage.

20. The vehicle of claim 15, wherein the processor is further configured to reconnect the battery upon receiving a request to turn off the vehicle.

* * * * *